(12) United States Patent
Rashid et al.

(10) Patent No.: US 11,815,534 B2
(45) Date of Patent: Nov. 14, 2023

(54) CURRENT SENSING

(71) Applicant: Cirrus Logic International Semiconductor Ltd., Edinburgh (GB)

(72) Inventors: Tahir Rashid, Tewkesbury (GB); Mehul Mistry, Newbury (GB)

(73) Assignee: Cirrus Logic Inc., Austin, TX (US)

( * ) Notice: Subject to any disclaimer, the term of this patent is extended or adjusted under 35 U.S.C. 154(b) by 7 days.

(21) Appl. No.: 17/678,345

(22) Filed: Feb. 23, 2022

(65) Prior Publication Data

US 2022/0276285 A1 Sep. 1, 2022

Related U.S. Application Data

(60) Provisional application No. 63/154,125, filed on Feb. 26, 2021.

(30) Foreign Application Priority Data

Mar. 18, 2021 (GB) ...................................... 2103788

(51) Int. Cl.
*G01R 19/00* (2006.01)
*H03G 3/30* (2006.01)
(52) U.S. Cl.
CPC ....... *G01R 19/0023* (2013.01); *H03G 3/3042* (2013.01)
(58) Field of Classification Search
CPC ................. G01R 19/0023; H03F 1/523; H03F 2200/426; H03F 2200/456; H03F 2200/462; H03F 2200/474; H03F 2200/498; H03F 2200/78; H03F 3/3022; H03G 3/3042
See application file for complete search history.

(56) References Cited

U.S. PATENT DOCUMENTS 7,015,745 B1 * 3/2006 Burinskiy ................. H03F 1/52
327/543
8,791,760 B2 * 7/2014 Nadimpalli ............. H03F 1/302
330/296

(Continued)

OTHER PUBLICATIONS

International Search Report and Written Opinion of the International Searching Authority, International Application No. PCT/GB2022/050455, dated Mar. 23, 2022.

(Continued)

*Primary Examiner* — Vinh P Nguyen

(74) *Attorney, Agent, or Firm* — Jackson Walker L.L.P

(57) ABSTRACT

This invention relates to current sensing, in particular for a signal processing circuit (500) for outputting an output signal (Sout) based on an input signal (Sin). An output stage (101) includes an output transistor (102) driven, in use, by a drive signal. A current monitor (501) is configured to monitor, in use, a first current through the output transistor, wherein the current monitor comprises a current sensor (105) having a sense transistor (106) configured to be driven based on the drive signal so as to generate a sense current related to the first current. A compensation controller (301) receives an indication of signal level of the input signal and controllably varies operation of the current monitor (501) so as to at least partially compensate for signal-dependent variation in a relationship between the first current and the first sense current.

19 Claims, 3 Drawing Sheets

(56) References Cited

U.S. PATENT DOCUMENTS

| | | | |
|---|---|---|---|
| 8,928,364 B2* | 1/2015 | Wimpenny | H03F 1/025 |
| | | | 327/108 |
| 9,806,685 B1* | 10/2017 | Hansen | G01R 19/0061 |
| 9,837,974 B2* | 12/2017 | Lin | H03F 3/193 |
| 9,859,856 B1* | 1/2018 | Kauffman | H03F 3/45273 |
| 11,239,656 B2* | 2/2022 | Hastings | H02H 9/025 |
| 2004/0174217 A1 | 9/2004 | Wenske | |
| 2018/0069518 A1 | 3/2018 | Lin | |

OTHER PUBLICATIONS

Combined Search and Examination Report under Sections 17 and 18(3), UKIPO, Application No. GB2103788.2, dated Dec. 23, 2021.

* cited by examiner

CURRENT SENSING

The field of representative embodiments of this disclosure relates to methods, apparatus and/or implementations concerning or relating to current sensing, and in particular to current sensing for driver or amplifier circuits.

Many electronic devices include some current sensing or monitoring capability, for instance for current limiting or protection. In some applications current sensing may be performed by passing the current to be monitored through a sense resistance and measuring the resulting voltage drop. However, including such a sense resistance in the relevant current path may be disadvantageous in some applications, for example due to reducing headroom. Additionally or alternatively it may be undesirable to connect monitoring circuitry to the relevant current path for noise reasons.

In some applications current sensing or monitoring may thus be performed using current mirroring techniques, where the current through a separate sense path is controlled to have a defined relationship to the current to be monitored. The current in the sense path can then be monitored without any detrimental impact on the actual current path, e.g. headroom or noise.

Figure 1:
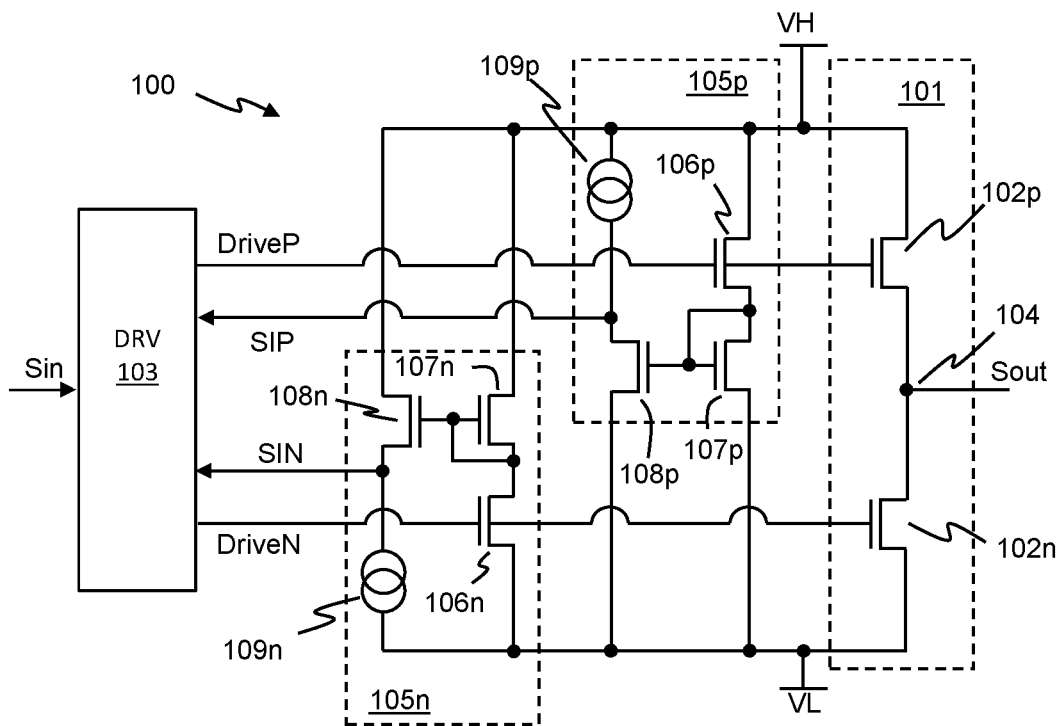

FIG. 1 illustrates one example of how such current sensing may be employed, in this example for an output driver or amplifier circuit 100. In this example the driver circuit 100 includes an output stage 101, for example a class AB output stage, which includes positive and negative output devices 102$p$ and 102$n$, which may for instance be a PMOS transistor and NMOS transistor respectively, connected between high-side and low-side voltages VH and VL. In use, the output devices 102$p$ and 102$n$ are controlled by respective drive signals, DriveP and DriveN, from drive circuitry 103 to generate a desired output signal Sout, based on an input signal Sin.

In use, it may be desirable to monitor the current through the output devices 102$p$ and 102$n$, for current limiting and protection purposes, e.g. to prevent unduly high currents that may result in unwanted behaviour or damage. The driver circuitry 100 thus includes respective current sensors 105$p$ and 105$n$ for sensing current through the relevant output device 102$p$ and 102$n$ and providing a respective current signal SIP and SIN that can be used for current limiting.

The current sensor 105$p$ includes a sense transistor 106$p$, which is also driven by the drive signal DriveP for the output device 102$p$. The sense transistor 109$p$ has a defined scaling or ratio with the output device 102$p$, so that the current through the sense transistor 106$p$ has a defined relationship to the current through the output device 102$p$ that it is wished to monitor.

The sense transistor is arranged in a first circuit branch of the current sensor 105, in series with a diode connected transistor 107$p$. The sense current through the sense transistor 106$p$ controls the gate voltage of diode connected transistor 107$p$ to pass the sense current. This gate voltage also controls the conduction of a transistor 108$p$, which is connected, in a second circuit branch, in series with a current source 106$p$ that provides a defined reference current. The node between the current source and transistor 108$p$ provides a current sense output signal SIP, that depends on the sense current, and hence the monitored output current.

The current monitor 105$n$ has similar components that operate in the same way to provide to current sense signal SIN, and similar components are identified using the same reference numerals but with the suffix -n (and such components may be referred to generically by the reference numeral without a suffix).

The current sense signals SIP and SIN can be monitored, for example by the driver circuitry 103, and can indicate if any current limiting is required. If so, the driver circuitry may operate to vary the appropriate drive signal DriveP or DriveN so as to limit the relevant current.

Such a current sensing arrangement is advantageous in providing a simple, chip scale implementation for current sensing, that allows for monitoring of the current through the output devices 102$p$ and 102$n$ of the output, without requiring any sense resistance in the output paths, which may reduce the amplifier headroom. However, in some instances the accuracy of the current sensing may be relatively low.

Embodiments of the present disclosure relate to methods and apparatus for current sensing that at least mitigate at least some of the above-mentioned issues.

According to an aspect of the disclosure there is provided a signal processing circuit for outputting an output signal based on an input signal comprising:

an output stage comprising a first transistor driven, in use, by a first drive signal;

a current monitor configured to monitor, in use, a first current through said first transistor, wherein the current monitor comprises a first current sensor having a first sense transistor configured to be driven based on said first drive signal so as to generate a first sense current related to the first current; and a compensation controller configured to receive an indication of signal level of the input signal and controllably vary operation of the current monitor based on said indication of signal level so as to at least partially compensate for signal-dependent variation in a relationship between the first current and the first sense current.

In some examples, the compensation controller may be configured to controllably vary operation of the current monitor by controllably varying a device scaling of the first sense transistor with respect to the first transistor. Additionally or alternatively, the compensation controller may be configured to controllably vary operation of the current monitor by controllably varying a source resistance for the first sense transistor.

In some examples, the compensation controller may be configured to output a first current sense output signal based on the first sense current and the compensation controller may be configured to controllably vary operation of the current monitor by controllably varying a gain applied to first current sense output signal.

The first current sensor may be configured to output a first current sense output signal based on the first sense current and the current monitor may be configured to compare the first current sense output signal with a threshold to detect an overcurrent. In such cases, the compensation controller may additionally or alternatively be configured to controllably vary operation of the current monitor by controllably varying said threshold. The current monitor may be configured to, in the event that the first current sense output signal crosses said threshold, to controllably vary the first drive signal to limit the first current.

In some examples the first current sensor may comprises a first circuit branch comprising the first sense transistor in series with a diode connected transistor, and a second circuit branch comprising a current source configured to provide a reference current in series with a second branch transistor, wherein a gate terminal of the second branch transistor is coupled to a gate terminal of the diode connected transistor and a node of the second circuit branch between the current source and the second branch transistor is configured to provide a first current sense output signal.

The compensation controller is configured to controllably vary operation of the current monitor by controllably varying the reference current. The compensation controller may be configured to controllably vary operation of the current monitor by controllably varying a source resistance for at least one of the diode connected transistor and the second branch transistor. The compensation controller may be configured to controllably vary operation of the current monitor by controllably varying a device scaling ratio of the diode connected transistor and the second branch transistor.

In some implementations, the first transistor may be connected between a voltage supply node of the output stage and an output node for outputting the output signal.

In some examples the output stage may further comprise a second transistor driven, in use, by a second drive signal. The current monitor may be further configured to monitor, in use, a second current through the second transistor. The current monitor may comprise a second current sensor having a second sense transistor configured to be driven based on the second drive signal so as to generate a second sense current related to the second current. The compensation controller may be further configured to controllably vary operation of the current monitor based on the indication of signal level so as to at least partially compensate for signal-dependent variation in a relationship between the second current and the second sense current.

In some examples the indication of signal level of the input signal may comprise an indication of signal envelope for the input signal. The signal processing circuit may comprise an envelope detector configured to receive a version of the input signal and determine an envelope value for the input signal and output said envelope value to the compensation controller. The input signal may be a digital signal. The signal processing circuitry may comprise a digital processing path configured to receive the input signal, a digital-to-analogue converter coupled to the digital processing path and an output driver coupled to the digital-to-analogue converter. The output driver may comprise the output stage and current monitor. The envelope detector may be configured to receive the version of the input signal from upstream of the digital processing path.

The signal processing circuit may further comprise a voltage controller for controllably varying at least one supply voltage for the output stage based on said envelope value.

The signal processing circuit may further comprise a wireless communication module, such as an RF module, for wirelessly receiving the input signal.

The output stage may comprise a linear amplifier output stage.

The signal processing circuit may be implemented as an integrated circuit.

An aspect also relates to an electronic device comprising the signal processing circuit of any of the embodiments described herein.

In another aspect there is provided a signal processing circuit for outputting an output signal based on an input signal comprising:
    an output stage for outputting the output signal;
    a current monitor configured to monitor, in use, a first current of the output stage, wherein the current monitor comprises a current mirror configured to generate a sense current related to the first current; and
    a compensation controller configured to receive an indication of signal level of the input signal and controllably vary operation of the current monitor based on said indication of signal level so as to at least partially compensate for signal-dependent variation in a relationship between the first current and the sense current.

In another aspect there is provided a signal processing circuit for outputting an output signal based on an input signal comprising:
    an output stage for outputting the output signal;
    a current monitor configured to monitor, in use, a first current of the output stage based on a sense current; and
    a compensation controller configured to receive an indication of signal level of the input signal and controllably vary operation of the current monitor based on said indication of signal level so as to at least partially compensate for signal-dependent errors in the sense current.

It should be noted that, unless expressly indicated to the contrary herein or otherwise clearly incompatible, then any feature described herein may be implemented in combination with any one or more other described features.

Figure 2:
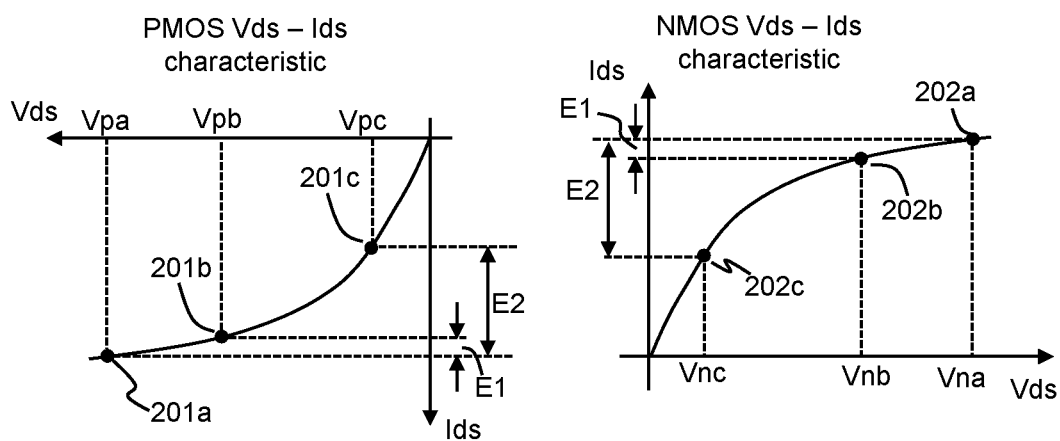
Figure 3:
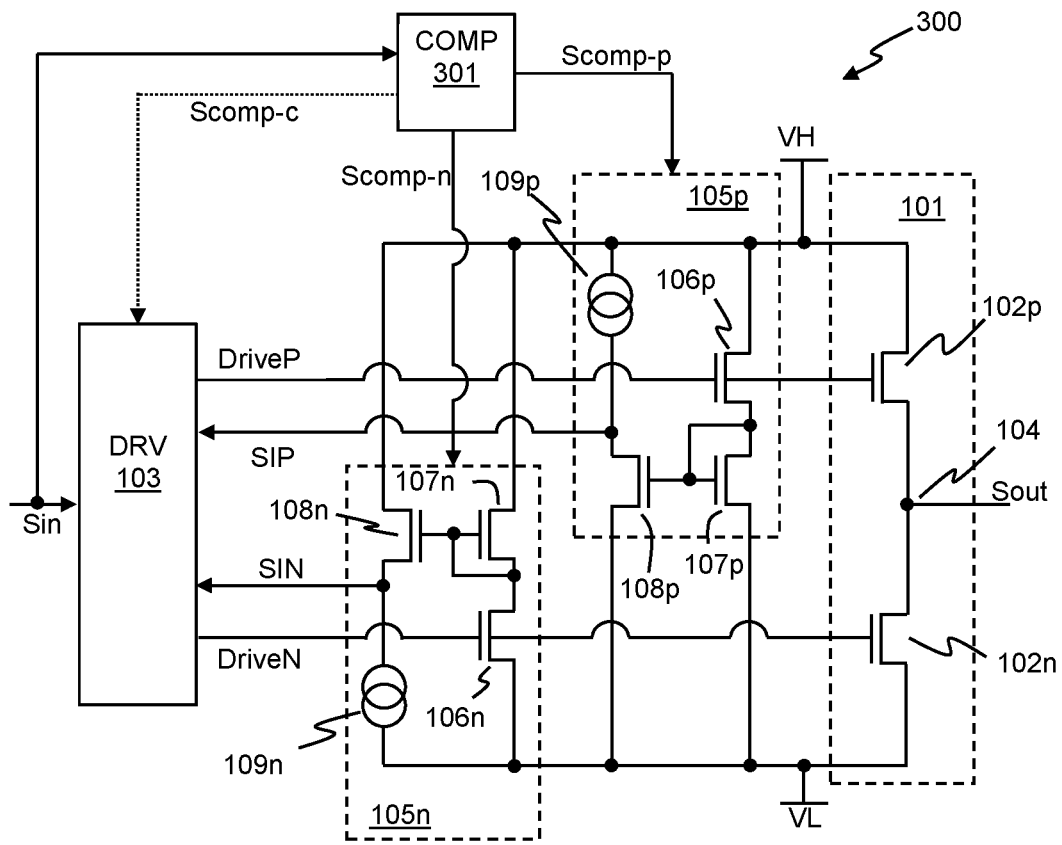
Figure 4:
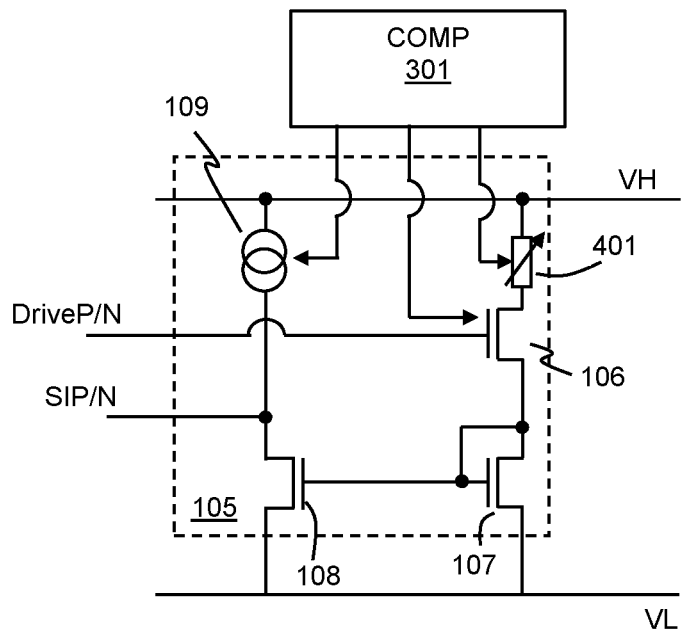
Figure 5:
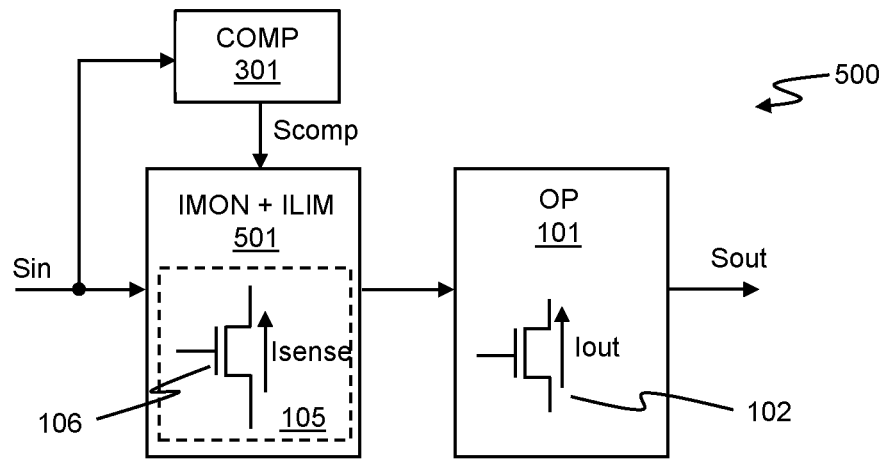
Figure 6:
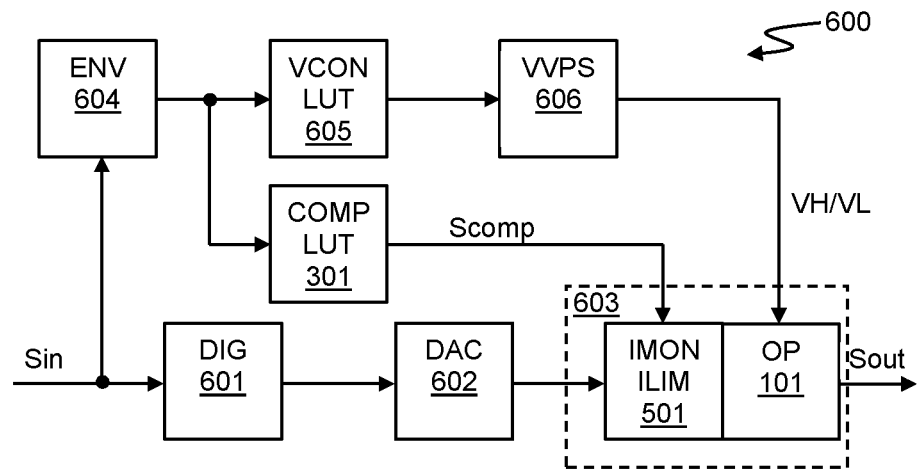

For a better understanding of examples of the present disclosure, and to show more clearly how the examples may be carried into effect, reference will now be made, by way of example only, to the following drawings in which:
    FIG. 1 illustrates one example of a driver circuit with current sensing;
    FIG. 2 illustrates example drain-source voltage and current characteristics for a PMOS device and an NMOS device;
    FIG. 3 illustrates one example of a circuit with current sensing with a signal dependent compensation according to an embodiment;
    FIG. 4 illustrates one example of how operation of a current sensor may be adjusted;
    FIG. 5 illustrates signal processing circuitry according to an embodiment; and
    FIG. 6 illustrates one example of an apparatus with a signal output path according to an embodiment.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As discussed above, FIG. 1 illustrates an example of driver circuitry 100, e.g. amplifier circuitry, for outputting an output signal Sout based on an input signal Sin, where the driver circuitry comprises current sensors 105$p$ and 105$n$ for sensing the current through output devices 102$p$ and 102$n$ respectively when conducting. Each current sensor comprises a respective sense transistor 106 which is driven by the relevant drive signal DriveP or DriveN for the monitored output device 102 so as to pass a sense current that has a defined relationship (depending on the scaling of the relevant devices) to the current through the output device.

One issue with such an approach is that, in use, the voltage at the output node 104 of the output stage 101 will vary with signal level. This means that the drain-source voltage across the output device 102 will vary, in use, as the signal output varies. By contrast, the drain-source voltage across the relevant sense transistor does not substantially vary with signal level. This can lead to a mismatch in drain-source voltage between the sense transistor 106 and the output device 102. As one skilled in the art will appreciate, for a transistor operating in the linear or ohmic region, a variation in drain-source current, for a given gate-source voltage, will result in a variation in the drain-source current.

FIG. 2 illustrates one example of the drain-source current and voltage characteristics for both a PMOS device and an NMOS device, for a given gate-source voltage. It will be understood that, in the ohmic or linear region of operation, the drain-source current will increase with increasing drain-source voltage, until a saturation current limit is reached and the transistor starts operating in the saturation region.

The output devices 102p and 102n are, in use, operated in the linear region and thus the current through these devices depends partly on the drain-source voltage across them, which varies with the level of the output signal Sout.

The output stage 101 is supplied with high-side and low-side voltages VH and VL respectively and the output signal Sout may thus vary within the voltage range defined by these voltages VH and VL, less appropriate headroom. The output signal Sout may vary about a midpoint voltage, Vmid, equal to (VH−VL)/2, with output device 102p conducting when the output signal Sout is positive (with respect to Vmid) and the output device 102n conducting when the output signal Sout is negative (with respect to Vmid).

The output device 102p is thus connected between the high-side voltage and the output node 104 and, as noted, conducts during a positive part of the waveform of the output signal Sout, when the voltage of the output signal can vary from the midpoint voltage Vmid up to a voltage near to VH. As the level of the output signal Sout varies, the voltage across the output device 102p, and hence the drain-source voltage Vds also varies, with a consequent variation in the drain-source current Ids for a given gate-source voltage.

FIG. 2 illustrates three different operating points to illustrate this behaviour. Operating point 201a corresponds to the magnitude of the output signal Sout being low (i.e. near Vmid), and thus the drain-source voltage Vds across the output device 102p being at a relatively high magnitude Vpa. The voltage Vpa could, for instance, correspond to the voltage across the output device 102p when the voltage of the output signal Sout is at the midpoint voltage, i.e. Vpa=VH−Vmid, which would correspond to the maximum voltage across the output device 102p during a positive part of the output waveform. Operating point 201b illustrates that if the level of the output signal Sout increases to say Voutb, the drain-source voltage Vds across the output device drops, to Vpb=VH−Voutb, with a consequent reduction in the drain-source current Ids for a given gate-source voltage. If the level of the output signal Sout increases further to a voltage Voutc at an operating point 201c, the drain-source voltage Vds will drop to a magnitude Vpc=VH−Voutc, which may be relatively low, with a further reduction in drain-source current.

For the sense transistor 106p, however, the drain-source voltage Vds will not vary in the same way with the output signal Sout. In the example of FIG. 1, the sense transistor 106p is connected in series with transistor 107p between the voltages VH and VL, and the transistor 107p is driven to pass the sense current through 106p. In this arrangement the voltage across the sense transistor 106p may not substantially vary in use and may be substantially equal to VH−Vmid.

Referring back to FIG. 2, the sense transistor 106p may thus effectively operate with a fixed operating point, for example operating point 201a, whereas the operating point for the output device 102p will vary with signal level. This can lead to an error in the sense current through the sense transistor 106p. If the output signal Sout has a voltage Voutb that corresponds to the output device operating at operating point 201b, whilst the sense transistor 106p is operating at the fixed operating point 201a, this will lead to an error E1 between the respective currents. If the output signal Sout has a voltage Voutc that corresponds to the output device operating at operating point 201c, whilst the sense transistor 106p is operating at the fixed operating point 201a, this will lead to an error E2 between the respective currents.

FIG. 2 also shows that a similar error may occur for the output device 102n, when conducting during the negative part of the output waveform. FIG. 2 again illustrates three operating points for the NMOS devices, where operating point 202a may correspond to a drain-source voltage magnitude Vna across the sense transistor 106n, and operating points 202b and 202c illustrate how the drain-source voltage Vds across the output device 102n may vary in use with signal level.

This mismatch in drain-source voltage can thus result in an error between the output current through the output device 102 and the respective sense current through the respective sense transistor 106. It will be appreciated that the extent of the error varies with signal level and the peak error, over the course of a cycle of the output signal waveform, will depend on the amplitude of the output signal Sout. Such an error in the sense current can be problematic, especially when used for current limiting purposes. It will be appreciated that the sense current through the sense transistor 106 will, in the example described above, tend to overestimate the current through the output device 102. If current limiting is thus implemented based on the sense current, this could result in current limiting being incorrectly applied, i.e. when the sense current indicates the current is over a relevant current threshold whereas the actual current through the output device is still within safe limits. Current limiting being applied when not required can result in distortion or other unwanted artefacts in the output signal. To avoid such incorrect triggering of current limiting, the relevant threshold used for the sense current to implement current limiting could be set higher, i.e. allowing for a defined margin of error in the sense current. However, as the amount of error varies with amplitude of the input signal, allowing a sufficient margin of error to avoid false triggering of current limiting for high amplitude signals may mean that an actual overcurrent occurring at a lower signal amplitude may not be detected.

Whilst drain-source voltage mismatch can be a significant source of signal dependent error in some applications, other errors associated with the current sensing may additionally or alternatively be present which may also be signal dependent, for instance gate-source voltage errors may arise for some applications.

In embodiments of the present disclosure a signal dependent adjustment or compensation is applied to the current sensing, e.g. to dynamically adjust the operation of the current sensor 105 to mitigate for signal dependent error in the current sensing. The adjustment may be based on an indication of signal level of the input signal Sin. As the value of the output signal Sout depends on the input signal Sin, a signal level of the input signal Sin can be monitored to determine an appropriate compensation to be applied to the current sensing, so as to at least partially compensate for the signal dependent errors.

FIG. 3 illustrates one example of a driver circuit 300 according to an embodiment. The driver circuit 300 in this example is similar to that described with reference to FIG. 1, and similar components are identified by the same references, but the driver circuit 300 of FIG. 3 includes a compensation controller 301 for applying a signal dependent compensation to the current sensing.

The compensation controller 301 is configured, in this example, to receive an indication of the input signal Sin and generate appropriate compensation control signals to, at least partially, compensate for signal dependent errors in the current sensing. In the example of FIG. 3, the compensation controller 301 generates control signals Scomp-p and Scomp-n for controlling the operation of the current sensors 105$p$ and 105$n$, so as to dynamically control or adjust the operation of the current sensors to at least partially compensate for signal dependent error, such as a drain-source voltage mismatch.

The operation of a current sensor 105 could be controllably varied or adjusted in a number of different ways. FIG. 4 illustrates generically a current sensor 105, with the same structure as the current sensors 105$p$ and 105$n$ discussed above, and illustrates some of the ways the operation of the current sensor could be adjusted.

FIG. 4 illustrates that the operation of the current sensor 105 could be controlled by adjusting the device scaling or ratio of sense transistor 106 (compared to the output device 102). For instance, the sense transistor 106 could be a variable width device (or implemented by a plurality of independently selectable parallel elements) and the effective width of the sense transistor 106 could be controllably varied based on the indication of signal level. It will be understood that the drain-source current for the sense transistor 106, for a given gate-source voltage (and fixed drain-source voltage), will depend on the effective width. To compensate for the mismatch in drain-source voltage between the sense transistor 106 and the output device 102 discussed with reference to FIG. 2, the device scaling or ratio (e.g. effective width) could be controllably varied so as to be lower for higher output signal levels than for lower output signal levels.

Note that FIG. 4 illustrates that the scaling of the sense transistor 106 (with respect to the output device 102) may be controllably varied. Additionally or alternatively the scaling or ratio between the transistors 107 and 108 could be controllably varied, so as to vary the relationship between the current sense output signal SIP/SIN and the sense current through the sense transistor 106.

Additionally or alternatively the adjustment could be made by controllably varying a source resistance for at least one of the transistors of the current sensor. FIG. 4 illustrates a variable resistance 401 for the sense transistor 106, but transistors 107 and/or 108 could have associated variable source resistances.

The compensation controller may additionally or alternatively control the operation of the current sensor 105 by controlling the current source 109 so as to vary the defined current reference, which will thus controllably vary the relationship between current sense output signal SIP/SIN and the sense current through the sense transistor 106.

Thus, the sense current through the sense transistor 106 in response to a given strength of drive signal DriveP or DriveN and/or the relationship of the current sense output signal SIP/SIN to the sense current, can be controllably varied based on an indication of the signal level, so as to compensate for the signal dependent errors.

Referring back to FIG. 3, in some embodiments, at least some compensation could additionally or alternatively be applied by the driver circuitry 103 in processing the current sense output signals SIP and SIN and applying any current limiting e.g. in comparison with any defined current limits. For instance, the compensation could vary a gain, e.g. a conversion gain, applied to the current sense output signals SIP and SIN and/or vary any thresholds used for comparison for current limiting. Thus some compensation control Scomp-c could be applied to the driver circuitry 103.

FIG. 5 thus illustrates generally an example of signal processing circuitry 500 according to an embodiment, which outputs an output signal Sout based on an input signal Sin. The signal processing circuitry may, in at least some examples, comprise amplifier or driver circuitry, e.g. for driving a transducer. The signal processing circuitry includes an output stage 101 for outputting the output signal Sout that includes at least one output transistor 102 that, in use, passes a current Iout that it is wished to monitor. The output stage 101 may, for instance, comprise a linear amplifier output stage.

The signal processing circuitry 500 also includes current monitor 501, which in this example provides current monitoring and control, e.g. current limiting to prevent an over-current through the output device 102. The current monitor 501 includes at least one current sensor 105 for sensing the current through the output device 102 in use, where the current sensor comprises a sense transistor which is driven based on a drive signal applied to the monitored output device 102 so as to pass a sense current Isense with a nominal defined relationship to the current Iout. The current monitor 501 may thus process the sense current Isense to provide monitoring of the current Iout, and may, in some implementations, be configured to control the operation of the output stage 101 to provide current limiting. For instance, the current monitor may control the drive signal applied to the output device 102 to avoid the current Iout through the output device 102 exceeding a current limit.

The signal processing circuitry 500 also includes a compensation controller 301 for controlling a signal dependent adjustment or compensation applied by the current monitor 501, so as to at least partially compensate for signal dependent variations in the relationship between the sense current Isense and the monitored current Iout. In at least some examples, the compensation may be applied to compensate for signal dependent drain-source voltage Vds variations that affect the output device 102 and result in a signal dependent Vds mismatch between the output device 102 and the sense transistor 106.

The compensation may be applied in a number of different ways, such as in any of the examples described herein.

FIG. 5 illustrates that the compensation controller 301 may receive a version of the input signal and generate a compensation control signal Scomp for controlling the extent of adjustment or compensation applied by the current monitor 501.

In some examples the compensation could be controlled based on the instantaneous signal level, i.e. so as to generally vary the instantaneous signal level. In some applications, however, the compensation could be controlled based on the amplitude or envelope of the input signal. As discussed above with reference to FIG. 2, the error due to drain-source voltage mismatch may increase with signal level, and thus the maximum error depends on the amplitude of the output signal. For applications such as current limiting, it may be sufficient to apply a correction based on the amplitude of the output signal, and hence the peak error. This has the advantage that the adjustment applied to the current sensing need only be controllably varied at the rate of change of signal amplitude.

The compensation controller 301 may thus receive or determine an indication of the amplitude or envelope value for the input signal Sin and determine an appropriate compensation to be applied. In some instances the compensation controller may comprise a look-up table (LUT) or the like with predetermined stored values corresponding to appropriate compensation to be applied for different signal amplitudes or ranges of signal amplitudes. The compensation controller 301 may thus determine the amplitude of the input signal Sin and the appropriate compensation and output a corresponding compensation control signal Scomp.

To provide time for the appropriate compensation to be determined and the adjustment to the current monitor to be implemented it may, in some applications, be beneficial for the compensation controller 301 to receive the indication of the input signal level from sufficiently far upstream of the output stage to provide a signal look-ahead.

FIG. 6 illustrates one example of how signal dependent compensation could be applied. FIG. 6 illustrates apparatus 600 with a signal output path, for example an audio output path, for outputting the output signal Sout. The signal output path receives an input signal Sin, which in this example is a digital input signal. The input signal, which could, for example, represent a digital audio signal, may be received from some upstream circuitry, for instance retrieved from a memory of a host device or received from some communication module, such as an RF module for wireless communication or the like.

The output signal path of the apparatus 600 includes a digital signal path 601 which may apply various types of processing to the digital input signal Sin, for instance the digital signal path 601 may convert the form of the digital input signal and/or may apply any one or more of upsampling, interpolation, filtering or the like. A digital-to-analogue converter (DAC) 602 receives the processed input signal and converts it to an analogue signal which is supplied to a driver 603 for outputting the output signal Sout. The driver 603 includes an output stage 101 and current monitor 501 as discussed with reference to FIG. 5.

A version of the digital input signal Sin is also supplied to an envelope detector 604 to determine an envelope value for the input signal Sin. The envelope value is supplied to the compensation controller 301, which in this example comprises a look-up table which determines an appropriate compensation signal Scomp for the current monitor 501 based on the envelope value.

The envelope detector 604 receives a version of the input signal Sin which is tapped from upstream of the digital processing path 601. As will be understood by one skilled in the art, there will be a propagation delay or latency associated with the digital signal path, and this propagation delay or latency can provide sufficient time so that appropriate compensation can be applied by the current monitor 501 as the relevant part of the input signal reached the driver 603.

It will be noted that in some implementations an indication of the signal level of the input signal, e.g. an envelope or amplitude value, may be determined with a sufficient look-ahead for other reasons. For instance, at least some output drivers may be implemented to make use of class-G or class-H amplification techniques, as will be understood by one skilled in the art, and thus the voltage supplies to the driver 603 may be variable, in use, based on an indication of signal level.

FIG. 6 thus illustrates that the apparatus 600 may also comprise a voltage controller 605 that also receives the envelope value for the input signal Sin from the envelope detector 604 and which determines appropriate voltages for the output driver 603 and which controls a variable voltage power supply 606, such as a variable voltage charge pump or the like, to provide appropriate supply voltages VH and VL to the driver 603. The voltage controller 605 may, in some implementations, also be implemented as a LUT.

It will be understood that some designs of driver circuitry may thus already include an envelope detector 604, together voltage controller 605 and variable voltage power supply 606. Adding a compensation controller 301 and allowing adjustment of the current monitor 501 may therefore not involve significant addition components with associated size and cost implications, but the addition of a compensation controller can allow for more accurate current sensing using current mirroring type sensing techniques.

Embodiments of the present disclosure thus relate to current sensing in which a current monitor is arranged to monitor current through a first transistor. The current monitor comprises a sense transistor which is driven based on the drive signal for the first transistor, so as to provide a sense current related to the current through the first transistor that it is wished to monitor. Such current sensing is advantageous as it does not impact on the output range or noise of the output signal. Embodiments of the present disclosure make use of a knowledge of the level of the output signal to provide a signal dependent adjustment or compensation that at least partially compensates for signal dependent variations in the relationship between the sense current and the current through the first transistor. The adjustment can be made to the generation and/or processing of the sense current in a number of different ways, without significant impact on power. The signal dependent compensation can improve the accuracy of the current sensing and, in some embodiments, allow for more reliable current limiting to be applied.

In particular embodiments may be implemented as part of driver circuitry, e.g. amplifier circuitry, such as a linear amplifier like a class AB amplifier. The driver circuitry may be configured to drive a transducer, such as an audio output transducer like a loudspeaker, or an ultrasonic transducer or haptic transducer.

The driver circuitry may form part of an output chain for driving a transducer, such as an audio output chain. In some examples the output chain may comprise a variable voltage power supply, e.g. such as a charge-pump or other DC-DC voltage converter with a variable voltage output, for supplying at least one variable supply voltage to an amplifier stage of the output chain. The variable voltage power supply may, in some examples, be controlled based on an indication of signal level of an input signal to the output chain, for instance the driver circuitry may be configured to apply class-G and/or class-H amplifier techniques.

In some examples an input signal for the output chain may be received from a wireless communication module, e.g. from an RF module or wireless modem or the like. For instance, the output chain could form part of an accessory device, such as a headphone or earbud device or the like, which is configured to receive an input signal wirelessly and drive a transducer of the accessory device based on the received wireless input signal.

Embodiments may be implemented as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch, or a set of headphones or an earbud device or the like. The host device could be a games console, a remote control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance aspects of determining or applying an appropriate compensation, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A signal processing circuit configured to output an output signal based on an input signal comprising:
an output stage comprising a first transistor driven, by a first drive signal;
a current monitor configured to monitor a first current through said first transistor, wherein the current monitor comprises a first current sensor having a first sense transistor configured to be driven based on said first drive signal so as to generate a first sense current related to the first current; and
a compensation controller configured to receive an indication of signal level of the input signal and controllably vary operation of the current monitor based on said indication of signal level so as to at least partially compensate for signal-dependent variation in a relationship between the first current and the first sense current.

2. The signal processing circuit of claim 1 wherein the compensation controller is configured to controllably vary operation of the current monitor by controllably varying a device scaling of the first sense transistor with respect to the first transistor.

3. The signal processing circuit of claim 1 wherein the compensation controller is configured to controllably vary operation of the current monitor by controllably varying a source resistance for the first sense transistor.

4. The signal processing circuit of claim 1 wherein the first current sensor is configured to output a first current sense output signal based on the first sense current and the compensation controller is configured to controllably vary operation of the current monitor by controllably varying a gain applied to first current sense output signal.

5. The signal processing circuit of claim 1 wherein the first current sensor is configured to output a first current sense output signal based on the first sense current and wherein the current monitor is configured to compare the first current sense output signal with a threshold to detect an overcurrent and the compensation controller is configured to controllably vary operation of the current monitor by controllably varying said threshold.

6. The signal processing circuit of claim 5, wherein, the current monitor is configured to, in the event that the first current sense output signal crosses said threshold, to controllably vary the first drive signal to limit the first current.

7. The signal processing circuit of claim 1 wherein the first current sensor comprises:
   a first circuit branch comprising the first sense transistor in series with a diode connected transistor; and
   a second circuit branch comprising a current source configured to provide a reference current in series with a second branch transistor, wherein a gate terminal of the second branch transistor is coupled to a gate terminal of the diode connected transistor; and
   a node of the second circuit branch between the current source and the second branch transistor is configured to provide a first current sense output signal.

8. The signal processing circuit of claim 7 wherein the compensation controller is configured to controllably vary operation of the current monitor by controllably varying the reference current.

9. The signal processing circuit of claim 7 wherein the compensation controller is configured to controllably vary operation of the current monitor by controllably varying at least one of:
   a source resistance for at least one of the diode connected transistor and the second branch transistor; and
   a device scaling ratio of the diode connected transistor and the second branch transistor.

10. The signal processing circuit of claim 1 wherein the first transistor is connected between a voltage supply node of the output stage and an output node for outputting the output signal.

11. The signal processing circuit of claim 1 wherein the output stage further comprises a second transistor driven, by a second drive signal and the current monitor is further configured to monitor, a second current through said second transistor, wherein the current monitor comprises a second current sensor having a second sense transistor configured to be driven based on said second drive signal so as to generate a second sense current related to the second current and the compensation controller is further configured to controllably vary operation of the current monitor based on said indication of signal level so as to at least partially compensate for signal-dependent variation in a relationship between the second current and the second sense current.

12. The signal processing circuit of claim 1 wherein said indication of signal level of the input signal comprises an indication of signal envelope for the input signal.

13. The signal processing circuit of claim 12 comprising an envelope detector configured to receive a version of the input signal and determine an envelope value for the input signal and output said envelope value to the compensation controller.

14. The signal processing circuit of claim 13 wherein the input signal is a digital signal and the signal processing circuit comprises:
   a digital processing path configured to receive the input signal;
   a digital-to-analogue converter coupled to the digital processing path; and
   an output driver coupled to the digital-to-analogue converter, wherein the output driver comprises said output stage and current monitor;
   wherein the envelope detector is configured to receive the version of the input signal from upstream of the digital processing path.

15. The signal processing circuit of claim 13 further comprising a voltage controller for controllably varying at least one supply voltage for the output stage based on said envelope value.

16. The signal processing circuit of claim 1 wherein the output stage comprises a linear amplifier output stage.

17. The signal processing circuit of claim 1 implemented as an integrated circuit.

18. An electronic device comprising the signal processing circuit of claim 1.

19. A signal processing circuit for outputting an output signal based on an input signal comprising:
   an output stage for outputting the output signal;
   a current monitor configured to monitor, a first current of the output stage, wherein the current monitor comprises a current mirror configured to generate a sense current related to the first current; and
   a compensation controller configured to receive an indication of signal level of the input signal and controllably vary operation of the current monitor based on said indication of signal level so as to at least partially compensate for signal-dependent variation in a relationship between the first current and the sense current.

* * * * *